April 5, 1966 S. W. SANDBERG, JR 3,243,869
PROCESS FOR PRODUCING THERMOELECTRIC ELEMENTS
Filed Nov. 27, 1962
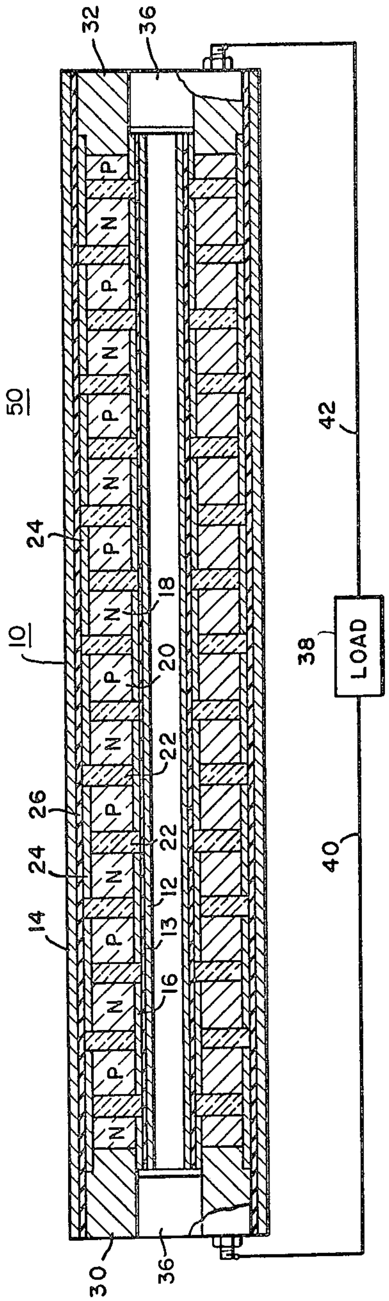
WITNESSES
John G. Chopp
Raymond F. Majesko
INVENTOR
Stewart W. Sandberg, Jr.
BY
C. L. Menzemer
ATTORNEY United States Patent Office 3,243,869
Patented Apr. 5, 1966

3,243,869

PROCESS FOR PRODUCING THERMOELECTRIC ELEMENTS

Stewart W. Sandberg, Jr., Penn Hills Township, Allegheny County, Pa., assignor to Westinghouse Electric Corporation, Pittsburgh, Pa., a corporation of Pennsylvania Filed Nov. 27, 1962, Ser. No. 240,384
4 Claims. (Cl. 29—155.5)

This is a continuation-in-part of my copending application Serial No. 98,036, filed March 24, 1961 and now abandoned.

The present invention relates to integral tubular thermoelectric elements produced by mechanical deformation.

In producing thermoelectric devices, one of the most difficult problems is the application of good electrical contacts to a body of thermoelectric material proper. The thermoelectric materials for both cooling and power generation applications are almost always comprised of semiconductor or ceramic-like materials. It is critically necessary that the electrical contacts which ordinarily are metallic, be bonded to the thermoelectric material almost perfectly so that the lowest possible electrical drop occurs therebetween. Also, the contact member must be so mechanically or physically joined that it will not loosen or become detached during service condition when substantial temperature differences prevail in the devices and the members expand or contract in different amounts.

Those skilled in the art will appreciate the extreme difficulties in soldering, brazing or otherwise joining a metallic contact to a semiconductor or ceramic material, the latter often being brittle, to attain these desired objectives. A high percentage of defective or unsatisfactory devices occur routinely even in the best processes now in use. During service, many failures may take place because of the gradual weakening or mechanical failure of the bond between the metallic contacts and the body of thermoelectric material.

An object of the present invention is to provide for concurrently joining at least two thermoelectric bodies to metal contact members by mechanically deforming to a substanital degree an assembly comprising two cylindrical insulated metal members concentrically disposed about each other with at least two washers of thermoelectric material disposed therebetween, the washers having metal bridging ring members disposed on the inner and outer surfaces, and sintering the deformed assembly, whereby to provide well bonded electrical contacts comprising the bridging ring members joined to the thermoelectric bodies and to produce a thermoelectric element in which the inner and outer cylindrical metal members form a hot and cold junction and are bonded in good thermal conducting relation to the electrically connected thermoelectric bodies.

Another object of the invention is to provide a process for producing an integral thermoelectric element, by assembling within an inner and outer cylindrical metal member, a plurality of compressed bodies of powdered thermoelectric material, electrical insulation interposed between the bodies, bridging electrical contacts between certain portions of the bodies of thermoelectric material and insulation between the cylindrical members and the bridging members, to provide a closely packed assembly, then mechanically deforming the entire assembly until the outer cylindrical member has a reduction in area of from 1% to 15%, the inner cylindrical member being solid during the mechanical deformation at least when the reduction in area exceeds about 5%, and sintering the deformed assembly at the sintering temperature of the bodies of thermoelectric material to provide a metallurgical bond between the thermoelectric bodies and the bridging electrical contacts.

A further object of the invention is to provide an integral thermoelectric element comprising a series of thermoelectric bodies electrically joined in series within an outer cylindrical metal member and an inner cylindrical metal member electrically insulated therefrom but in good thermal conducting relation therewith, the element having been produced by hammer swaging the entire assembly until the outer cylindrical member has a reduction in area of from 1 to 15% and sintering the deformed assembly at the sintering temperature of the bodies of thermoelectric material to provide a metallurgical bond between the thermoelectric bodies and the bridging electrical contacts.

Other objects of the invention will, in part be obvious, and will in part, appear hereinafter.

For a better understanding of the nature and objects of the invention, reference should be had to the following detailed description and drawing, the single figure of which is:

A thermoelectric device produced in accordance with the teachings of the invention.

In accordance with the present invention and in attainment of the foregoing objects, there is provided a process for producing an integral thermoelectric element by assembling within an inner and outer cylindrical metal member, a plurality of compressed bodies of powdered thermoelectric material, electrical insulation interposed between the bodies, bridging electrical contacts between certain portions of the bodies of thermoelectric material and the insulation between the cylindrical members and the bridging members, to provide a closely packed assembly, then mechanically deforming the entire assembly until the outer cylindrical member has a reduction in area of from 1% to 15%, the inner cylindrical member being solid during the mechanical deformation at least when the reduction in area exceeds about 5% and, sintering the deformed assembly at the sintering temperature of the bodies of thermoelectric material to provide a metallurgical bond between the thermoelectric bodies and the bridging electrical contacts.

More particularly, there is provided an integral, elongated, thermoelectric element comprising a series of thermoelectric bodies electrically joined in series within an outer cylindrical metal member and an inner cylindrical metal member electrically insulated therefrom but in good thermal conducting relation therewith. The element is produced by disposing a plurality of inner bridging metal ring members on an insulated cylindrical metal member. The bridging ring members may be electrically insulated from the cylindrical member by disposing a relatively thin insulating cylindrical member therebetween either prepared separately or produced in situ by plasma jet spraying an insulating material, such as alumina, on the inner cylindrical member. When employing a series of adjacent bridging ring members, they will be electrically insulated from each other. The bridging ring members may comprise any good electrically conductive metal such, for example, as nickel, copper, aluminum, iron or base alloys thereof.

A plurality of compressed washers of powdered thermoelectric material are disposed between the bridging ring members and a plurality of outer bridging metal ring members are disposed between the other ends of the compressed washers of thermoelectric material so that the thermoelectric washer members are electrically connected at one end thereof by either the inner or outer concentric bridging ring members while the washers are electrically insulated at the other end. The thermoelectric washer members are prepared by compressing powdered thermoelectric materials in a suitable die to a density of about 85% and higher. The insulating materials employed between the thermoelectric washers may comprise any good inorganic electrical insulators such as, silica, alumina, and beryllium oxide and inorganic silicates, such as borosilicate and lime glasses, and those materials comprising the reaction product of mica and lead borate glass sold under the trade name of Mycalex and materials comprising magnesium silicates sold under the trade name Lavite.

The number of thermoelectric washer members employed will determine the number of metal bridging ring members needed to provide electrical contacts thereon. It is preferred that each pair of thermoelectric washers electrically contacted consist of a p-type thermoelectric material and an n-type thermoelectric material. An electrically insulated outer cylindrical metal member is then disposed on the outer bridging metal ring members. The bridging ring members may be electrically insulated from the outer cylindrical member by wrapping the bridging members with about 3 or 4 mils of an insulating material, such as, mica or a layer secured by porcelainizing the inner surface of the outer metal member. The components of the assembly are arranged so that the assembly is relatively close packed so that the total free or gap space in the assembly is not above about 1% of the diameter of the outer cylindrical member.

The entire assembly is then mechanically deformed, such as hammer swaging or hydraulic squeezing, until the outer cylindrical member has a reduction in area of from about 1% to 15%. The cylindrical metal members comprise a good electrically and thermally conducted material, such as, aluminum, stainless steel, pure iron and copper or base alloys thereof. The term "mechanical deformation" as used herein refers to any mechanical method for reducing the cross sectional area of a tubular member wherein plastic deformation occurs.

It should be understood that the inner cylindrical metal member may be hollow during mechanical deformation of the assembly when the reduction in area of the outer cylindrical metal member does not exceed about 5%. When it does exceed 5%, a mandrel may be disposed within the inner hollow cylindrical member until the swaging operation is completed. However, it should be understood that what ever the reduction in area, the inner cylindrical member initially may be a solid rod and after a hammer swaging operation an inner annulus may be drilled therethrough. The deformed assembly is then sintered at the sintering temperature appropriate to the bodies of thermoelectric material, for example, at about 650° C. for lead telluride, to provide a metallurgical bond between the bridging metal ring members and the thermoelectric washers so that an applied or induced electrical current will readily flow between said washers.

Referring to the figure, there is shown a thermoelectric device 50 comprising a mechanically deformed thermoelectric element 10. The element 10 comprises an inner cylindrical metal member 12 and a concentric outer cylindrical metal member 14. An insulating hollow cylindrical member 13 is disposed about and joined to member 12, the member 13 comprising a material such as alumina or porcelain. However, the insulating material may be plasma jet sprayed on the outer surfaces of the inner cylindrical member. A plurality of inner bridging ring members 16 are disposed about and joined to the insulating member 13, the ring members being electrically insulated from each other by means of insulating washers 22 comprising materials, such as, those selling under the trade name of Lavite or Mycalex disposed between the ring members. A plurality of washer members of thermoelectric material are disposed on and joined to the bridging metal ring member 16, each alternate thermoelectric washer comprising an n-type thermoelectric material 18, such as, lead telluride or a p-type thermoelectric material 20, such as, lead telluride. The thermoelectric washers are electrically insulated by means of the insulating washers 22. A plurality of outer bridging metal ring members 24 are disposed on and joined to the thermoelectric washer members 18 and 20, the ring members each contacting a pair of p- and n-type thermoelectric washer members. The ring members 24 are electrically insulated from each other by means of insulating washers 22. A hollow concentric insulating cylindrical member 26 comprising a material such as alumina or mica is disposed about and joined to the outer ring members and the outer cylindrical metal member 14 is disposed about and joined to the insulating cylindrical member 26.

End plugs 36 are then inserted into, and soldered to, the ends of the thermoelectric element 10.

The mechanical deformation operation and the subsequent sintering provides an intimate and effective metallurgical bond between the bridging metal ring members and the thermoelectric washers so as to provide good electrical contacts on the thermoelectric washer members whereby the thermoelectric washers are electrically connected in series. Also, a good bond allowing good heat flow is formed between the outer cylindrical metal member 14 and the insulating cylindrical member 26 and between the insulating member 26 and the metal ring member 24. Similarly, a good bond is formed between the inner hollow cylindrical metal member 12 and the inner cylindrical insulating member 14 and between the insulating member 14 and the inner metal ring members 16.

Electrical connector clamps 30 and 32 may be then attached to the thermoelectric element 10 to form a thermoelectric device 50. The device 50 may then be connected to a load 38 by means of electrical leads 40 and 42 attached to the clamps 30 and 32.

The reason for such an arrangement is that generally the inner cylindrical metal members of the device is particularly suited to serve for passing hot temperature gases and liquids so as to make this the hot side, and the outer cylindrical metal members of the device can be exposed to a cooling medium to serve as the cold side of a thermocouple. The inner cylindrical members may be conveniently heated by passing hot water, steam, a flame or the like therethrough. The outer cylindrical member may be cooled by flowing water or cold gases or air thereover. The difference in temperature between the hot side and the cold side will cause an electrical current to be generated in the thermoelectric device by the phenomenon which is known in the art as the Seedbeck effect. However, it should be understood that the inner metal member may serve as the cold side and the outer metal member as the hot side.

The following example is illustrative of the teachings of the invention.

*Example I*

A thermoelectric device similar to that shown in FIGURE 1 was assembled. The inner cylindrical member employed was a cold roller steel rod (0.494"D. x 8") having .003" sprayed coating of alumina. The bridging contact ring members consisted of low carbon steel and were two different sizes. The inner contacts measured 0.502" 0.502" I.D. The outer insulating washers measured 1.002" I.D. and 1.016" O.D. The thermoelectric washers employed consisted of p- and n-type lead telluride having a density of 85% of theoretical and measuring 1.000" O.D. and 0.518" I.D. The insulating material between alternate thermoelectric washers and bridging contacts consisted of Lavite washers and were of two sizes. The inner insulating washers measured 0.1000" O.D. and 0.502" I.D. The outer insulating washers measured 1.016" O.D. and 0.518" I.D. The outer bridging contacts were wrapped with 0.003" thick mica sheet one and one-half turns. The outer cylindrical member consisted of an annealed steel tube 9" long and measuring 1.060"

O.D. and 1.028″ I.D. The total gap space of the assembly in the radial direction was 0.009″.

End plugs were then inserted and soldered at the ends of the assembly. The assembly was then hammer swaged through a first die having a diameter of 1.030″ to a total reduction of 5.6%. The swaged assembly was then hammer swaged through a second die having a diameter of 1.000″ for an additional reduction of 4.4%, the total reduction in area being 10%. A portion of the total reduction (about 1.7%) was for the purpose of taking up or closing the total gap space of .009″.

After boring a 0.406″ hole in the cylindrical rod, the swaged assembly was sintered at about 625° C. for four hours.

The device was tested by inserting a rod heater and eight thermocouples in the bore. A temperature difference of 400° C. was maintained between the outer and inner cylindrical members when the outer side was cooled with water. Wire leads were attached as shown in FIGURE 1 and the voltage of the device was measured over a period of about 100 hours. The measurement indicated a voltage of about 400 $\mu$v./° C./ couple and 1¼ volts for the device without deterioration of the thermoelectric element.

It will be understood that other thermoelectric materials such for example as bismuth selenide telluride, germanium telluride and lead selenide may be substituted for the materials in the above example.

It is intended that the foregoing description and drawing be construed as illustrative and not limiting.

I claim as my invention:

1. In a process for producing an integral thermoelectric element, the steps comprising assembling within an inner and outer cylindrical metal member, a plurality of compressed bodies of powdered thermoelectric material, electrical insulation interposed between the bodies, bridging electrical contacts between certain portions of the bodies of thermoelectric material and insulation between the cylindrical members and the bridging members to provide a closely packed assembly, then mechanically deforming the entire assembly until the outer cylindrical member has a reduction in area of from 1% to 15%, the inner cylindrical member being solid during the mechanical deformation at least when the reduction in area exceeds about 5% and, sintering the deformed assembly at the sintering temperature of the bodies of thermoelectric material to provide a metallurgical bond between the thermoelectric bodies and the bridging electrical contacts.

2. In the process of producing a thermoelectric element, the steps comprising disposing a plurality of inner bridging metal ring members on an insulated cylindrical metal member, the ring members being electrically insulated from each other, disposing a plurality of compressed washers of powdered thermoelectric material on the ring members, disposing a plurality of outer bridging metal ring members on said thermoelectric washers, the ring members being electrically insulated from each other, disposing an insulated outer cylindrical metal member on the ring members, the assembly having a gap space of not above about 1% of the diameter of the outer cylindrical member sealing the ends of the cylindrical metal members to provide a closure for the individual components therein, mechanically deforming the entire assembly until the outer cylindrical member has a reduction in area of from 1% to 15%, the inner cylindrical member being solid during mechanical deformation at least when the reduction in area exceeds about 5%; and sintering the deformed assembly at the sintering temperature of the bodies of thermoelectric materials to provide a metallurgical bond between the bridging metal ring members and the thermoelectric washers so that an applied or induced current will flow between said washers.

3. In the process of producing a thermoelectric element, the steps comprising disposing a plurality of inner bridging metal ring members on an insulated cylindrical metal member, the ring members being electrically insulated from each other, disposing a plurality of compressed washers of powdered thermoelectric material on the ring members, disposing a plurality of outer bridging metal ring members on said thermoelectric washers, the ring members being electrically insulated from each other, disposing an insulated outer cylindrical metal member on the ring members to provide a closely packed assembly, sealing the ends of the cylindrical metal members to provide a closure for the individual components therein and hammer swaging the entire assembly until the outer cylindrical member has a reduction in area of up to 5%; and sintering the deformed assembly at the sintering temperature of the bodies of thermoelectric material to provide a metallurgical bond between the bridging metal ring members and the thermoelectric washers so that an applied or induced current will flow between said washers.

4. In the process of producing a thermoelectric element, the steps comprising disposing a plurality of inner bridging metal ring members on an inner cylindrical member consisting of cold rolled steel and having a relatively thin layer of alumina on the outer surfaces thereof, the ring members being electrically insulated from each other with a material comprising the reaction product of mica and lead borate glass, disposing a plurality of compressed washers of powdered thermoelectric material comprising p- and n-type lead telluride on the ring members, disposing a plurality of outer bridging metal ring members on said thermoelectric washers, the ring members being electrically insulated from each other, disposing an outer cylindrical member consisting of annealed steel and having a relatively thin layer of mica on the inner surfaces thereof on the ring members to provide a closely packed assembly, sealing the ends of the cylindrical metal members to provide a closure for the individual components therein and mechanically deforming the entire assembly until the outer cylindrical member has a reduction in area of from 1% to 15%, the inner cylindrical member being at least solid during mechanical deformation when the reduction in area exceeds about 5%; and sintering the deformed assembly at a temperature of about 625° C. for the period of the order of four hours to provide a metallurgical bond between the bridging metal ring members and the thermoelectric washers so that an applied or induced current will flow between said washers.

References Cited by the Examiner

UNITED STATES PATENTS

| | | | |
|---|---|---|---|
| 2,543,331 | 2/1951 | Okolicsani | 136—4 |
| 2,805,272 | 9/1957 | Postal | 136—4 |
| 2,854,556 | 9/1958 | McOrlly | 29—155.65 X |
| 3,041,914 | 7/1962 | Gurton et al. | 29—517 X |

WHITMORE A. WILTZ, *Primary Examiner.*

JOHN F. CAMPBELL, *Examiner.*

P. M. COHEN, *Assistant Examiner.*